United States Patent
Cuvalci et al.

(10) Patent No.: US 9,202,674 B2
(45) Date of Patent: Dec. 1, 2015

(54) PLASMA REACTOR WITH A CEILING ELECTRODE SUPPLY CONDUIT HAVING A SUCCESSION OF VOLTAGE DROP ELEMENTS

(75) Inventors: Olkan Cuvalci, Sunnyvale, CA (US); Yu Chang, San Jose, CA (US); William Kuang, Sunnyvale, CA (US); Anqing Cui, Sunnyvale, CA (US); Seshadri Ganguli, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1536 days.

(21) Appl. No.: 12/255,492

(22) Filed: Oct. 21, 2008

(65) Prior Publication Data
US 2010/0096085 A1    Apr. 22, 2010

(51) Int. Cl.
*H01J 37/32* (2006.01)
*C23C 16/455* (2006.01)

(52) U.S. Cl.
CPC ........... *H01J 37/3244* (2013.01); *C23C 16/455* (2013.01); *H01J 37/32091* (2013.01); *H01J 37/32541* (2013.01)

(58) Field of Classification Search
USPC ...................................................... 118/723 R
See application file for complete search history.

(56) References Cited

U.S. PATENT DOCUMENTS

| 4,915,978 A | * | 4/1990 | von Campe et al. | ...... | 118/723 E |
| 5,755,886 A | * | 5/1998 | Wang et al. | ............... | 118/723 E |

\* cited by examiner

*Primary Examiner* — Dah-Wei D Yuan
*Assistant Examiner* — Stephen Kitt
(74) *Attorney, Agent, or Firm* — Robert M. Wallace

(57) ABSTRACT

A bridge assembly includes an electrically insulating hollow tube or bridge having a pair of ends, the bridge being supported at one of the ends over the cylindrical side wall and being supported at the other of the ends over the electrode. The bridge assembly further includes a set of conductive rings surrounding the hollow tube and spaced from one another along the length of the bridge, and plural electrically resistive elements. Each of the resistive elements has a pair of flexible connectors, respective ones the resistive elements connected at their flexible connectors between respective pairs of the rings to form a series resistor assembly.

9 Claims, 9 Drawing Sheets

PLASMA REACTOR WITH A CEILING ELECTRODE SUPPLY CONDUIT HAVING A SUCCESSION OF VOLTAGE DROP ELEMENTS

BACKGROUND

Plasma reactors are employed for processing workpieces such as semiconductor wafers, by carrying out such processes as plasma enhanced chemical vapor deposition, plasma enhanced etching, plasma enhanced physical vapor deposition, among various examples. The reactor may maintain a plasma inside its chamber by capacitive coupling of RF plasma source power. Typically, such capacitive coupling involves the use of the reactor chamber ceiling as a ceiling electrode driven by an RF source power generator, while other components of the reactor chamber, including the chamber side wall, are grounded. Process gas may be introduced into the chamber through a gas distribution showerhead included in the ceiling electrode. The process gas may be supplied through an internal conduit within the grounded chamber side wall. A supply conduit extends between the side wall and the ceiling showerhead. Depending upon the amount of RF source power applied to the ceiling electrode, the path traveled by the process gas from the side wall to the ceiling electrode has a very large voltage difference, sufficient to ignite plasma within the supply conduit if the voltage drop is non-uniform. Therefore, there is a need to provide a smooth voltage drop along the length of the supply conduit.

SUMMARY

A bridge assembly is used to transport process gas in a plasma reactor for processing a workpiece, the reactor having a cylindrical side wall and a ceiling including a gas distribution showerhead that is also an RF-hot ceiling electrode. The bridge assembly includes an electrically insulating hollow tube or bridge having a pair of ends, the bridge being supported at one of the ends over the cylindrical side wall and being supported at the other of the ends over the electrode. The bridge assembly further includes a set of conductive rings surrounding the hollow tube and spaced from one another along the length of the bridge, and plural electrically resistive elements. Each of the resistive elements has a pair of flexible connectors, respective ones of the resistive elements connected at their flexible connectors between respective pairs of the rings to form a series resistor assembly having a pair of ends, the flexible connector at one of the ends being coupled to the electrical potential of the side wall, and the flexible connector at the other one of the ends being coupled to the electrical potential of the ceiling electrode.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
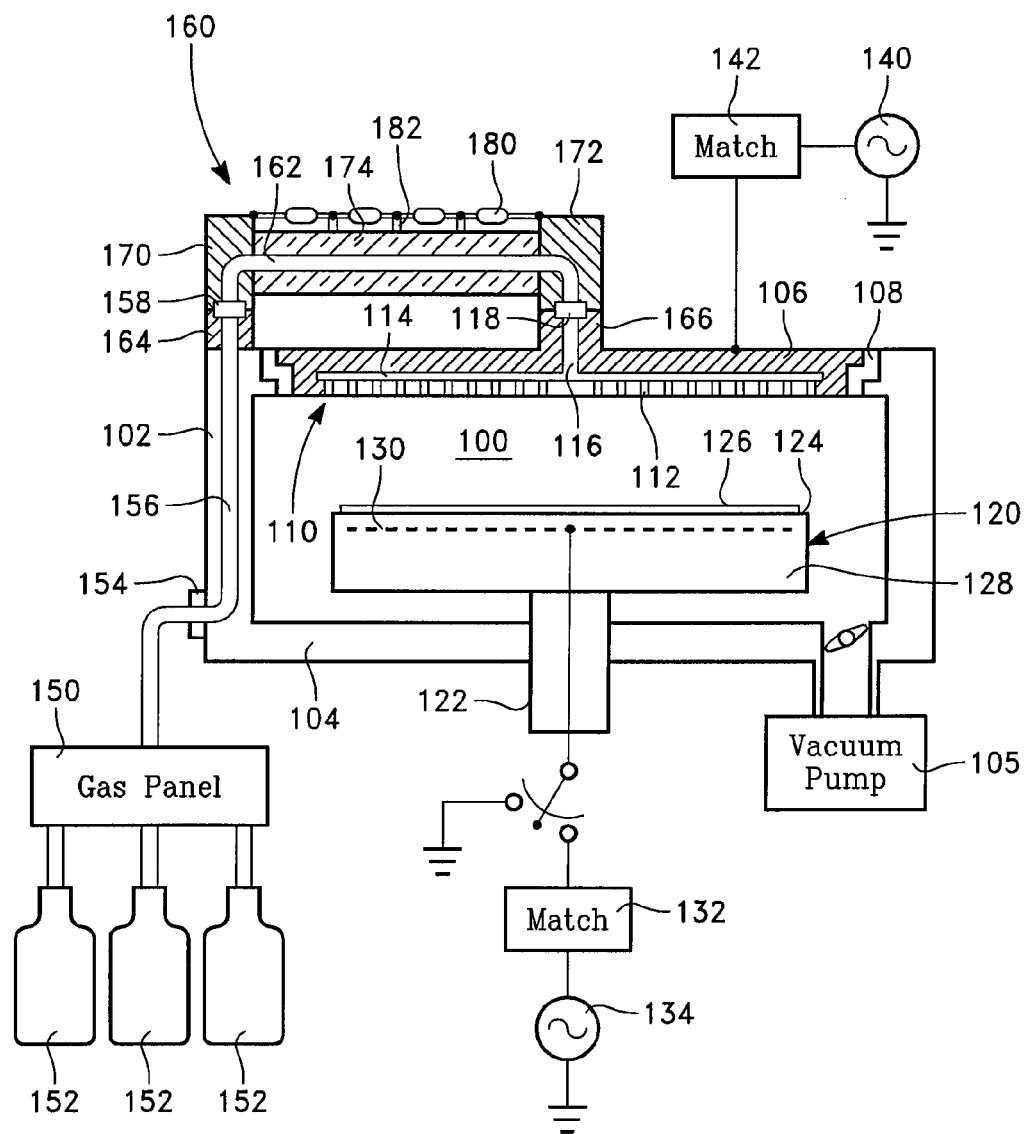
FIG. 1 is a side view of a plasma reactor having a gas conductive bridge assembly furnishing process gas to the ceiling gas showerhead, and including a resistive element along the length of the bridge assembly.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Referring to FIG. 1, a plasma reactor in accordance with one embodiment has a vacuum chamber 100 enclosed by a grounded conductive side wall 102, which may be cylindrical, a floor 104 and a ceiling 106. The plasma reactor of FIG. 1 may be employed in carrying out plasma-enhanced chemical vapor deposition processes on a workpiece. Alternatively, the plasma reactor may be employed in carrying out plasma-enhanced physical vapor deposition processes or plasma-enhanced reactive ion etch processes on the workpiece. A vacuum pump 105 evacuates the chamber 100 through the floor 104. The ceiling 106 is conductive and is electrically insulated from the side wall 102 by an insulator ring 108. The ceiling 106, the side wall 102 and (optionally) the floor 104 may be formed of a metal such as aluminum, for example. The ceiling 106 includes a gas distribution showerhead 110 as an array of gas injection orifices 112 coupled to an internal gas distribution manifold 114 within the ceiling 106. An internal gas supply conduit 116 within the ceiling 106 extends from a top gas receptacle 118 of the ceiling to the gas distribution manifold 114. A workpiece support pedestal 120 has an underlying support column 122 extending through the floor 104. The workpiece support pedestal 120 provides a workpiece support surface 124 for holding a workpiece 126 during processing. The pedestal 120 can optionally include an insulating puck 128 providing the workpiece support surface 124 and enclosing an optional internal electrode 130 insulated from the workpiece 126. The internal electrode 130 may be connected to ground or, alternatively, may be connected through an impedance match 132 to an RF bias power generator 134. Alternatively, in the absence of an internal electrode, the pedestal 120 may be conductive and be connected to either ground or, instead, to an RF bias power source, for example. RF plasma source power is furnished by an RF plasma source power generator 140 coupled through an impedance match 142 to the ceiling 106, so that the ceiling 106 is an electrode that capacitively couples RF source power to plasma in the chamber 100. The side wall 102 and the floor 104 may be grounded.

Process gas is supplied to the gas receptacle 118 from a gas distribution panel 150 that may receive different process gas species from separate supplies 152. The gas flows from the panel 150 to a lower receptacle 154 in the side wall 102. An internal gas flow channel 156 extends upwardly through the side wall 102 from the lower receptacle 154 to a top receptacle 158. A radially extending gas flow bridge (or bridge assembly) 160 conducts the process gas through an internal channel 162 from the top receptacle 158 of the side wall 102 to the top receptacle 118 of the ceiling 106. Supporting the bridge assembly 160 are a side wall post 164 on a top edge of the side wall 102 and a ceiling post 166 on the center of the ceiling 106. The side wall gas flow channel 156 extends through the side wall 102 and through the side wall post 164. The ceiling gas flow channel 116 extends through the ceiling post 166. The gas flow bridge assembly 160 includes a side wall manifold 170 resting on the side wall post 164, a ceiling manifold 172 resting on the ceiling post 166 and a hollow tube 174 extending between the manifolds 170, 172. The internal channel 162 extends through the hollow tube 174. The axial length of the hollow tube 174 is selected to precisely match the axial distance between the side wall manifold 170 and the ceiling manifold 172, in order to provide a vacuum seal of the hollow tube 174 between the two manifolds 170, 172.

The ceiling 106 and the ceiling manifold 172 are both held at a high RF potential or voltage by the source power generator 140, while the side wall 102 and the side wall manifold 170 are grounded. Therefore, there is a large voltage drop along the length of the hollow tube 174. To maintain the RF voltage difference between the manifolds 170, 172, the hollow tube 174 is formed of an electrically insulating material, which can be a fluoropolymer or glass, for example. Such a large voltage drop can lead to excessive voltage gradients at random locations along the length of the hollow tube 174. Excessive voltage gradients may lead to electric fields exceeding the breakdown (ionization) threshold of gases inside the hollow tube, leading to deleterious plasma ignition inside the hollow tube 174. To avoid or minimize such voltage gradients, the bridge assembly 160 further includes a resistive element along the length of the hollow tube 174, to uniformly distribute the RF voltage drop along its length, so as to avoid excessive voltage gradients at random locations along the length of the hollow tube 174. In the embodiment of FIG. 1, the resistive element is implemented as successive resistive elements 180 coupled in series along the length of the hollow tube 174 and connected between the high voltage ceiling manifold 172 and the grounded side wall manifold 170. Contacts 182 at each juncture between successive resistive elements 180 couple the voltage at the juncture to the interior of the hollow tube 174. We have found that implementing the resistive element as a continuous resistive element (such as a solid resistive sleeve—not shown—surrounding the hollow tube 174) can prevent either the formation of a seal of the hollow tube 174 between the manifolds 170, 172 or else prevent a continuous connection of the resistive element between the manifolds 170, 172. Specifically, if the resistive sleeve is longer than the hollow tube 174, then a vacuum seal of the hollow tube 174 between the manifolds 170, 172 is prevented. If the resistive sleeve is shorter than the hollow tube 174, then an electrical connection of the resistive element to either one or the other of the two manifolds 170, 172 is prevented. Such a problem occurs because the dimensional tolerances applicable to the hollow tube 174 and a resistive sleeve cannot be minimized without incurring unacceptable manufacturing costs.

Figure 2:
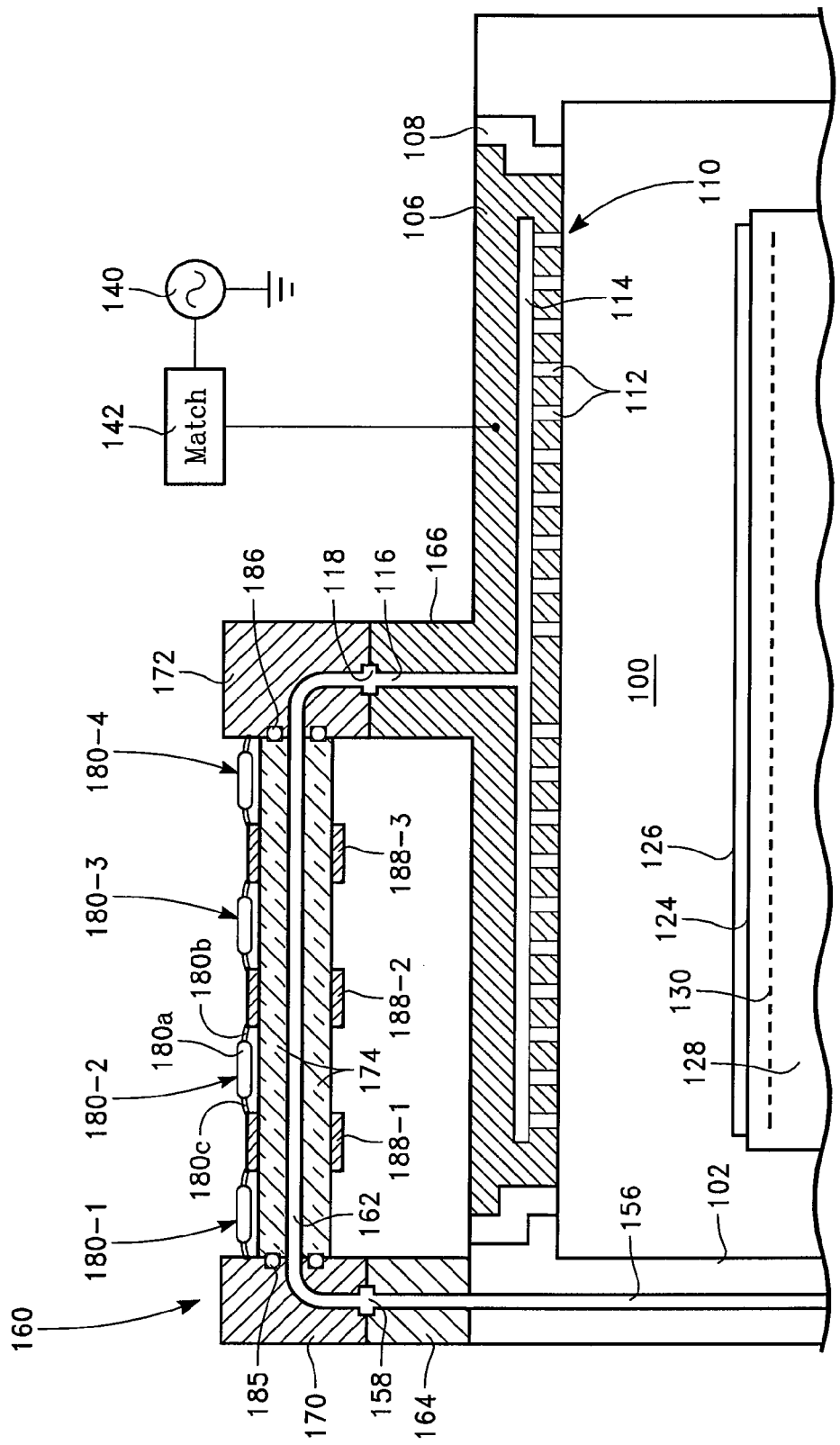
FIG. 2 is an enlarged view corresponding to FIG. 1 and depicting a first embodiment of the bridge assembly.

Referring to the enlarged view of FIG. 2, in one embodiment each resistive element 180 may be a two-terminal resistor, including a ceramic resistor piece 180a and flexible wire contacts 180b, 180c at the respective ends of the resistor piece 180a. In the embodiment of FIG. 2, there are four series resistors 180-1, 180-2, 180-3, 180-4. One wire contact of the first resistor 180-1 is connected to the side wall manifold 170, while one wire contact of the last resistor 180-4 is connected to the ceiling manifold 172. Each wire contact 180b, 180c being flexible, the series of resistors 180 imposes no mechanical tolerances on the assembly, a significant advantage. This solution permits the hollow tube 174 to be firmly embedded or compressed between the manifolds 170, 172 without interference. As shown in the enlarged view of FIG. 2, O-ring seals 185, 186 are employed at each end of the hollow tube 174 to form a seal.

In the embodiment of FIG. 2, the successive contacts 182 of FIG. 1 are implemented as metal rings 188 (i.e., rings 188-1, 188-2, 188-3) providing electrical connection between the successive resistors 180-1, 180-2, 180-3, 180-4. An advantage of the conductive rings 188 is that they enhance the azimuthal (circumferential) uniformity of the voltage inside the hollow tube 174.

Figure 3:
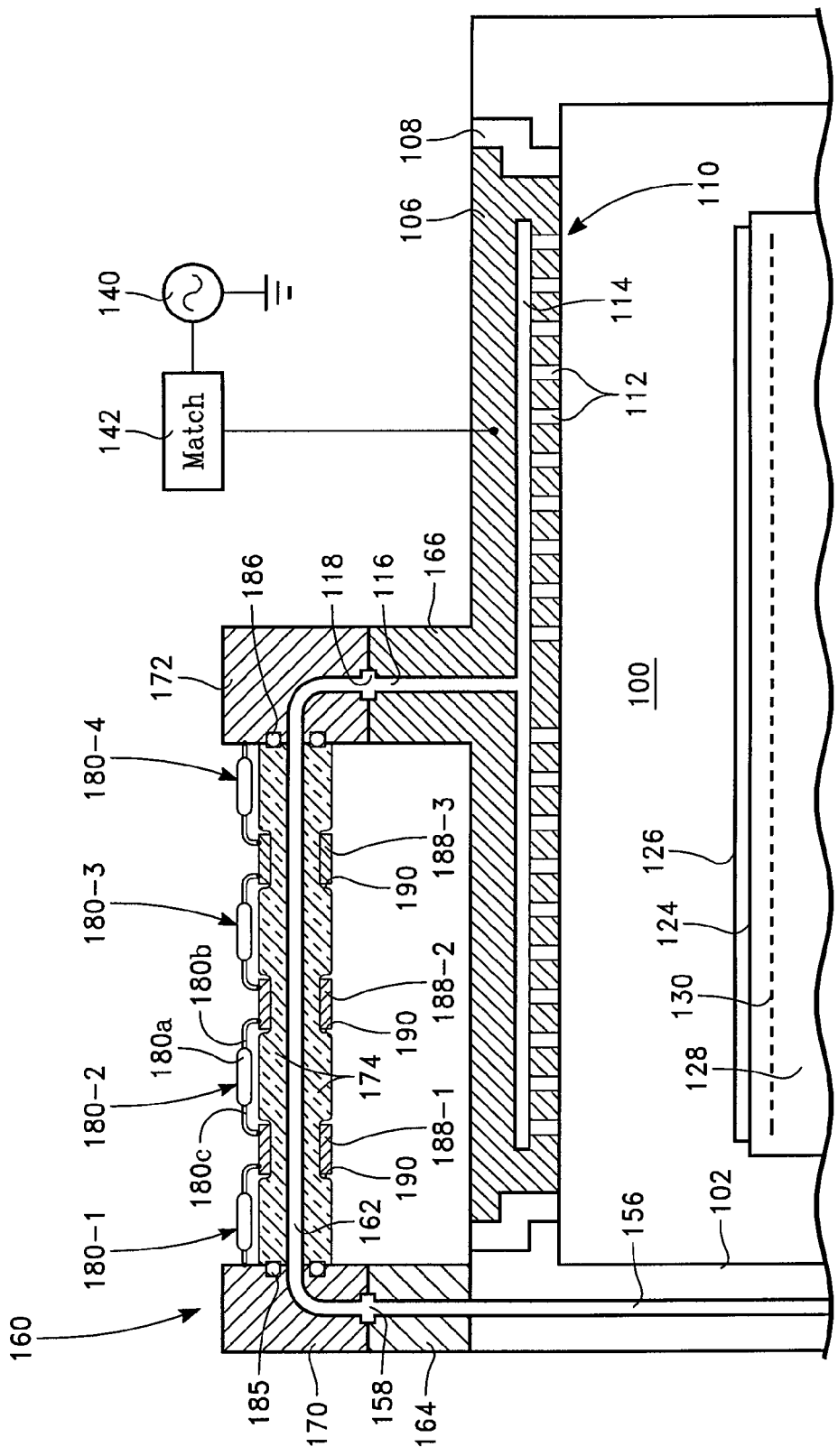
FIG. 3 is an enlarged view corresponding to FIG. 1 and depicting a second embodiment of the bridge assembly.

Referring to FIG. 3, in one embodiment the hollow tube 174 may include annular pockets 190 for receiving the conductive rings 188 so that the conductive rings 188 are flush with the surface of the hollow tube 174, or at least are further away from the high voltage top surface of the ceiling 106.

Figure 4:
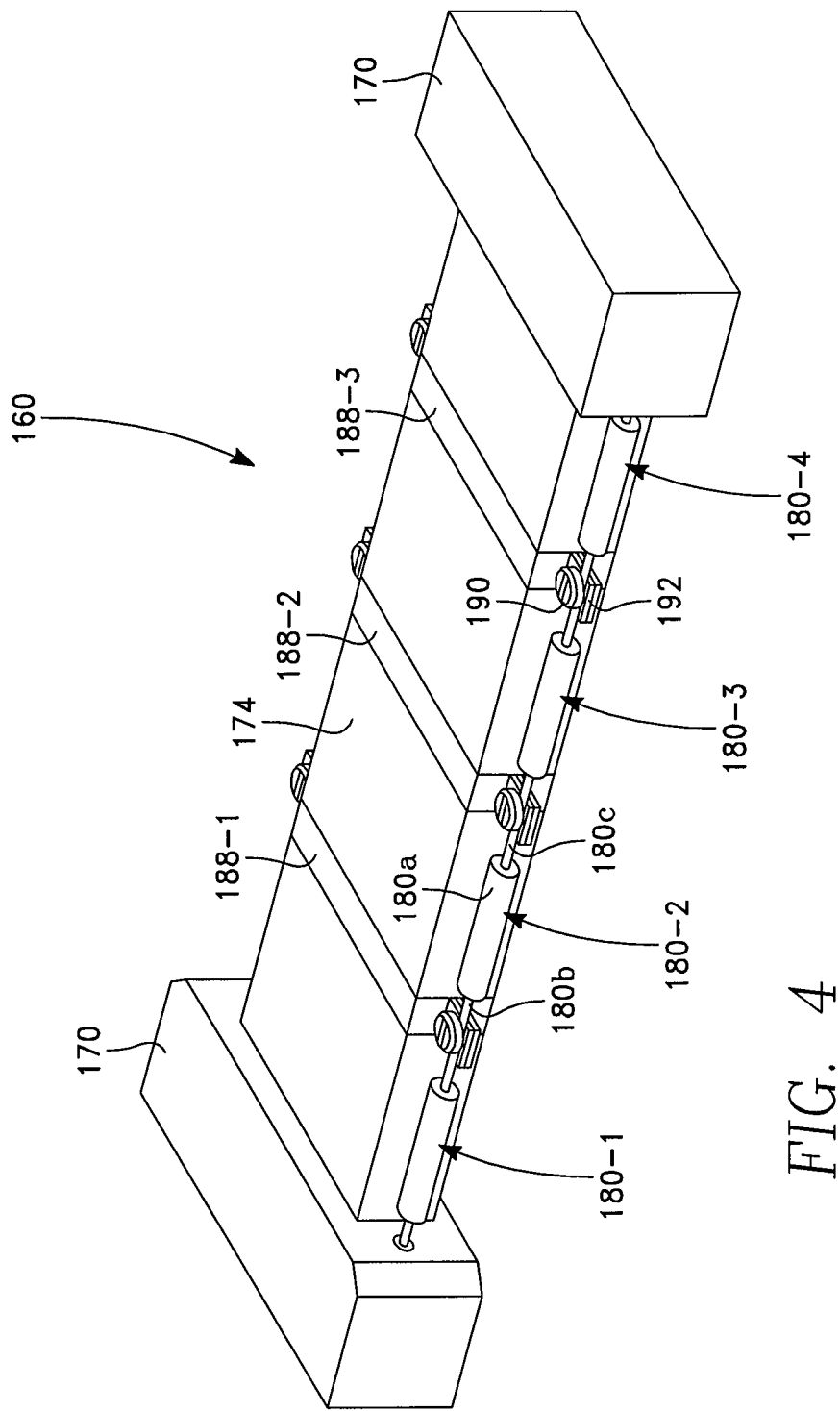
FIGS. 4 and 5 are orthographic and end views, respectively, of an embodiment of FIG. 3 having a rectangular cross-sectional shape.
Figure 5:
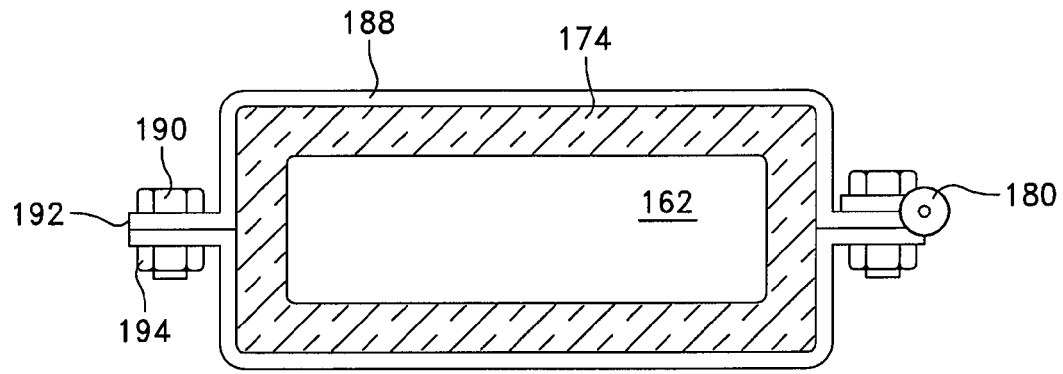

FIGS. 4 and 5 are orthographic and end views, respectively, of an embodiment of the bridge assembly 160 of FIG. 3 having a rectangular cross-section.

Figure 7:
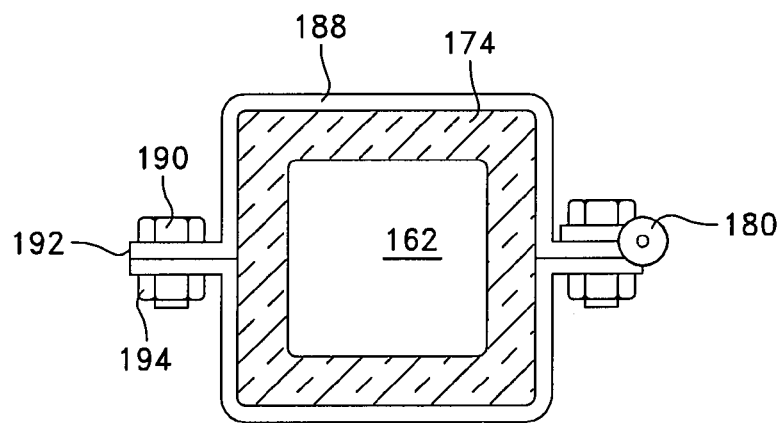
FIGS. 6 and 7 are orthographic and end views, respectively, of an embodiment of FIG. 3 having a square cross-sectional shape.
Figure 6:
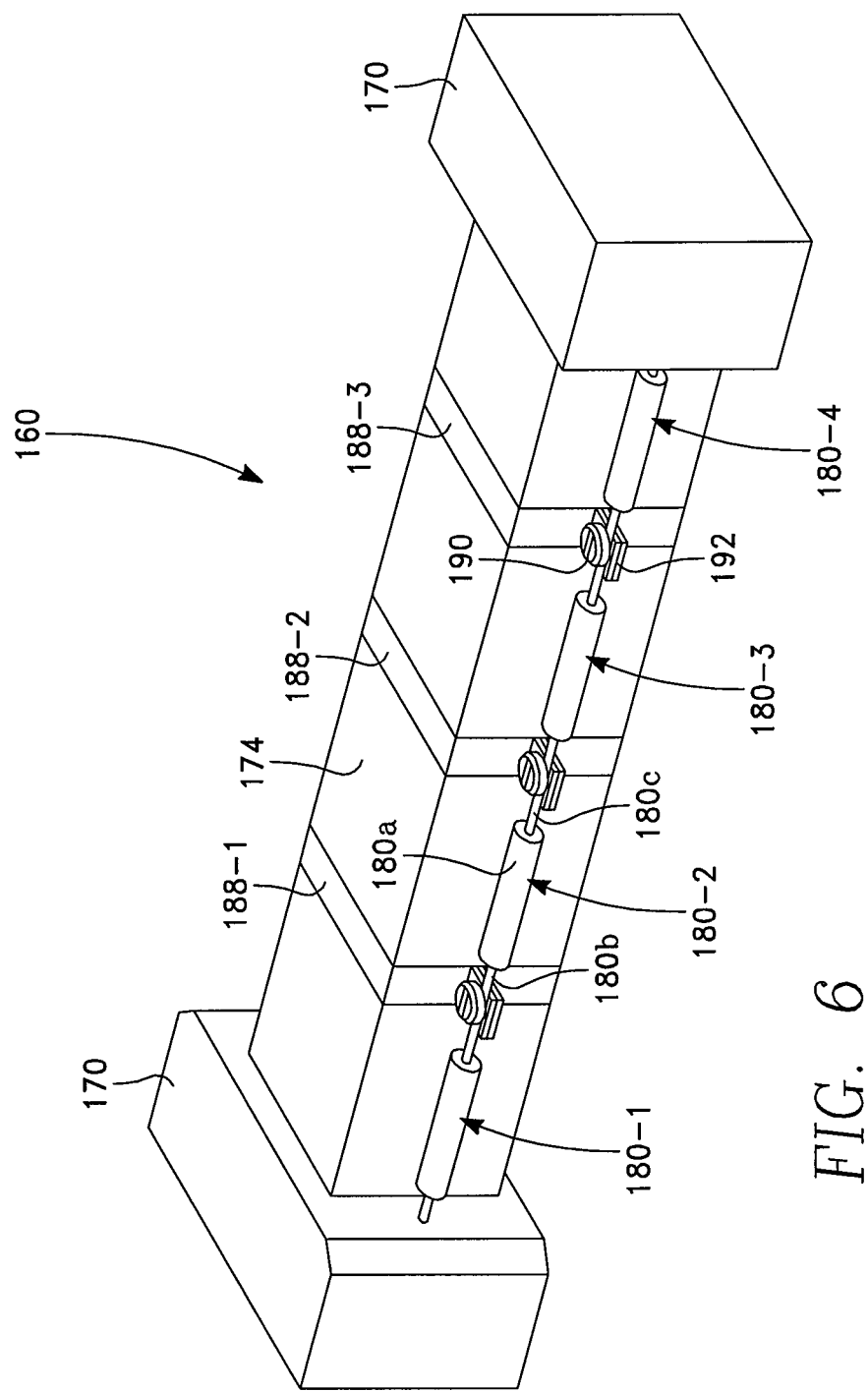

FIGS. 6 and 7 are orthographic and end views, respectively, of an embodiment of the bridge assembly 160 of FIG. 3 having a square cross-section.

Figure 9:
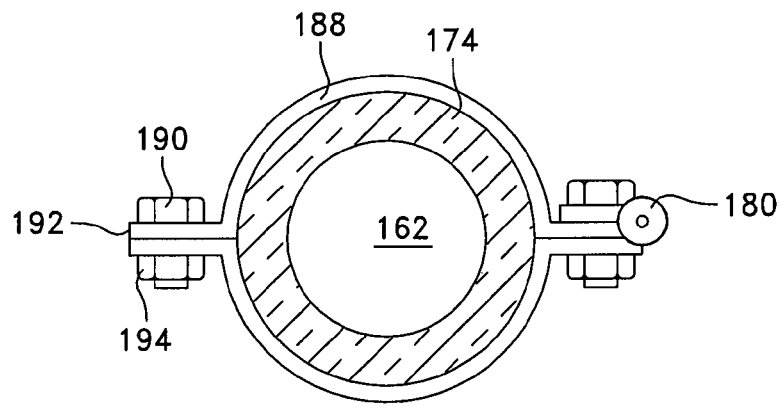
FIGS. 8 and 9 are orthographic and end views, respectively, of an embodiment of FIG. 3 having a circular cross-sectional shape.
Figure 8:
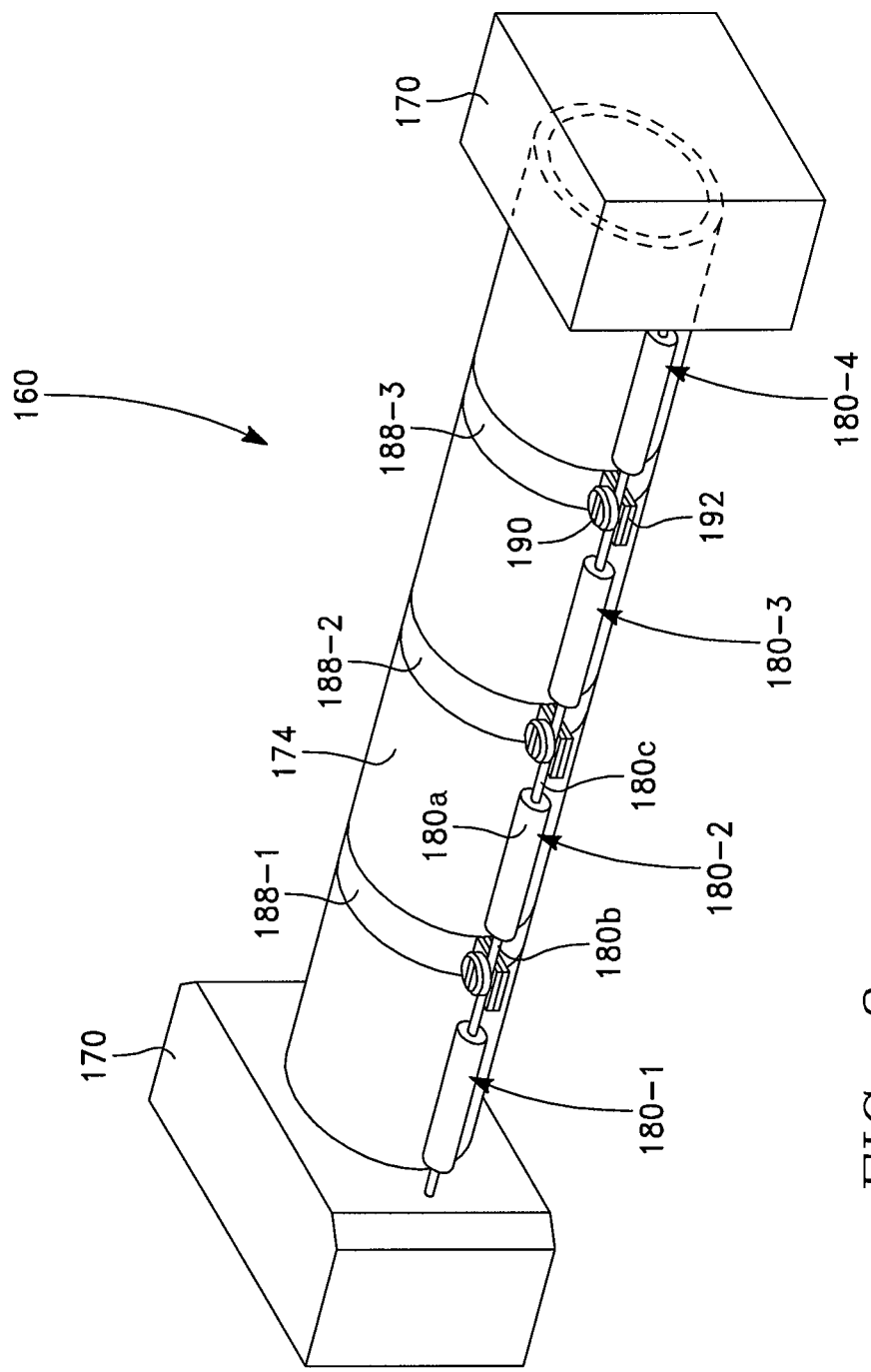

FIGS. 8 and 9 are orthographic and end views, respectively, of an embodiment of the bridge assembly 160 of FIG. 3 having a circular cross-section.

Figure 10:
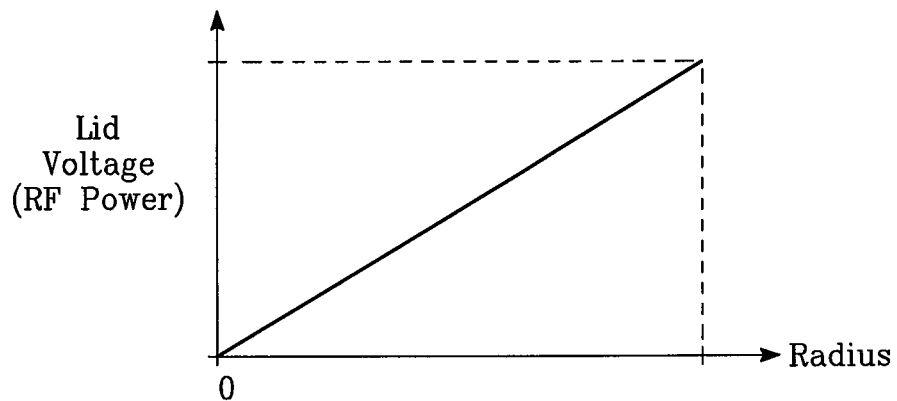
FIG. 10 is a graph depicting voltage as a function of position along the length of the bridge assembly in which the resistive element is implemented as a continuous piece along the length of the bridge assembly.

FIG. 10 is a graph depicting voltage as a function of position along the length of the hollow tube 174 in which a continuous resistive element, such as a solid resistive sleeve surrounding the hollow tube 174, is employed. FIG. 10 shows that the voltage drop is continuous along the length of the hollow tube 174.

Figure 11:
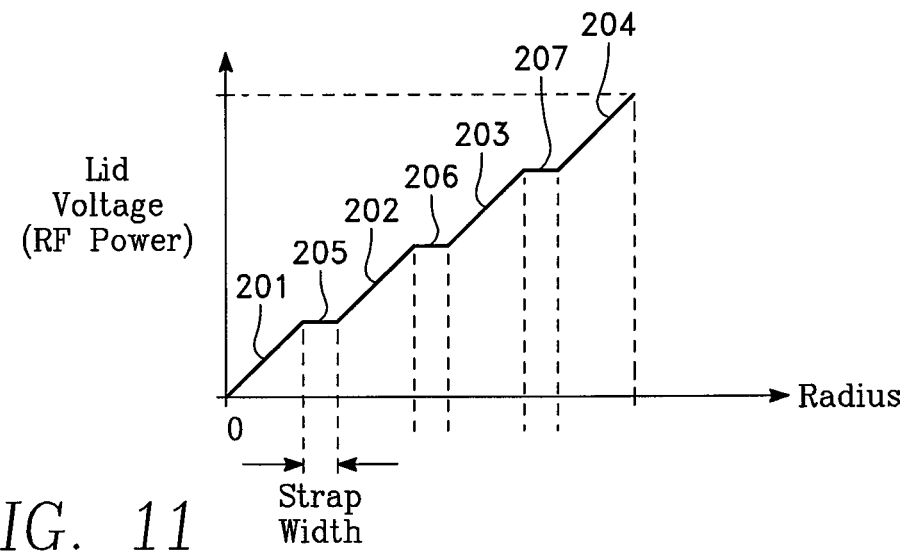
FIG. 11 is a graph depicting voltage as a function of position along the length of the bridge assembly of FIG. 2 or FIG. 3, in which the resistive element is implemented as a series of wire-connected discrete resistive elements along the length of the bridge assembly.

FIG. 11 is a graph depicting voltage as a function of position along the length of the hollow tube 174, in the embodiment of FIG. 3. FIG. 11 shows that the voltage distribution follows a step-wise pattern, in which constant voltage gradients 201, 202, 203, 204, extend between successive flat voltage steps 205, 206, 207, each flat voltage step corresponding to a zone surrounded by a corresponding one of the conductive rings 188. The slope of the voltage function of FIG. 11 is sufficiently smooth and gradual so as to avoid occurrence of electric field above the plasma ignition threshold. In a preferred mode, each of the resistance elements 180 has the same resistance as all the other resistance elements 180, at least to within a variance of about 1%. In this preferred mode, the rings 188 are of the same width and are equally spaced along the length of the hollow tube 174.

In a simple embodiment, the each of the rings 180 consists of two half rings, the two half rings each terminating in flat flanges 192 fastened together around the hollow tube by fasteners, such as a screw 193 and nut 194, for example.

Alternatively, each ring 180 may be a single ring or may be separated into more than two sections that are joined together.

In a more elaborate embodiment, the conductive rings 180 may be formed by conductive film deposition on the surface of the hollow tube 174.

Figure 12:
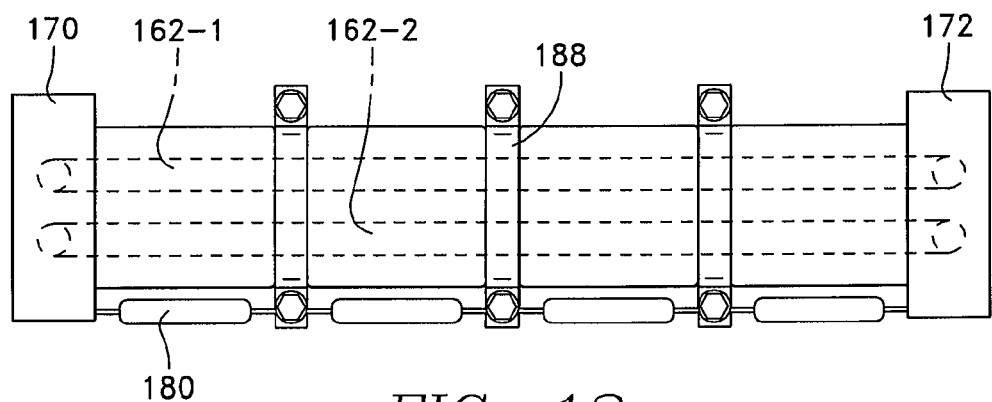
FIGS. 12 and 13 depict an embodiment of a bridge assembly having a pair of channels.
Figure 13:
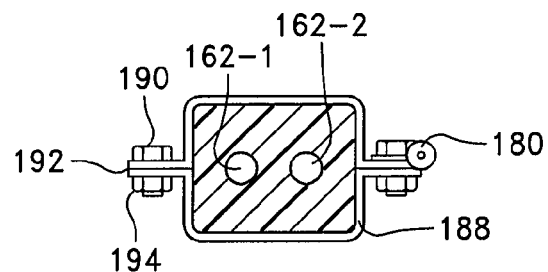
Figure 14:
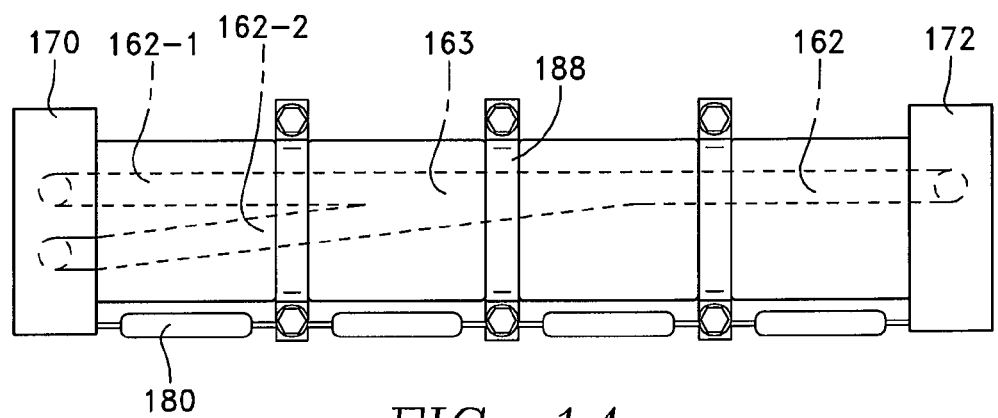
FIG. 14 depicts an embodiment in which the pair of channels merge to a single output channel 162.

The embodiments of FIGS. 1-3 have been described with reference to a single gas flow channel 162 within the tube 174 feeding a single array of gas injection orifices 112 of the showerhead 110 through a single gas distribution manifold 114. Although not depicted in the drawings, the showerhead 110 may have separate or independent zones of gas injection orifices fed through separate gas distribution manifolds (rather than the single manifold 114). In such a case, there may be plural parallel channels through the tube 174 (rather than the single channel 162) independently feeding gas to the separate zones of gas injection orifices of the showerhead 110 through the separate gas distribution manifolds. For example, FIGS. 12 and 13 depict an embodiment of the bridge assembly 160 in which the hollow tube 174 has a pair of channels 162-1 and 162-2 parallel to one another and connected to corresponding channels in the manifolds 170, 172. FIG. 14 depicts an embodiment in which the two channels 162-1, 162-2 merge together at a junction 163 to a single output channel 162. Two different gas sources may furnish process gases to the channels 162-1, 162-2, and the showerhead 110 has a single array of gas distribution orifices 112 supplied by the single output channel 162 of FIG. 14.

While the foregoing is directed to embodiments of the present invention, other and further embodiments of the invention may be devised without departing from the basic scope thereof, and the scope thereof is determined by the claims that follow.

What is claimed is:

1. A plasma reactor for processing a workpiece, comprising:
   a cylindrical side wall;
   a ceiling, said ceiling comprising a gas distribution showerhead, said showerhead comprising a conductive electrode insulated from said side wall;
   a power source coupled to said conductive electrode;
   an electrically insulating hollow tube, said tube having a pair of ends, said tube being supported at one of said ends over said cylindrical side wall and being supported at the other of said ends over said electrode;
   a set of conductive rings on and surrounding said tube and spaced from one another along the length of said tube;
   plural electrically resistive elements, each of said resistive elements comprising a pair of connectors comprising wire conductors, respective ones of said resistive elements connected at their connectors between respective pairs of said rings to form a series resistor assembly having a pair of ends, the connector at one of said ends being coupled to the electrical potential of said side wall, and the connector at the other one of said ends being coupled to the electrical potential of said ceiling electrode; and
   a side wall manifold comprising a first sealing face having a gas supply port connected to said one end of said hollow tube, and a ceiling manifold comprising a second sealing face having a gas receiving port connected to said other end of said hollow tube, said gas receiving port being in communication with said gas distribution showerhead.

2. The plasma reactor of claim 1 wherein said side wall is connected to RF ground.

3. The plasma reactor of claim 1 wherein:
   said side wall manifold is supported on and electrically coupled to said side wall, said side wall manifold supporting said one end of said tube;
   said ceiling manifold is supported on and electrically coupled to said ceiling electrode, said ceiling manifold supporting the other end of said tube.

4. The plasma reactor of claim 3 wherein said ends of said hollow tube abut respective ones of said first and second sealing faces.

5. The plasma reactor of claim 3 further comprising a process gas source and a gas supply receptacle in said side wall connected to said process gas source, and an internal passage in said side wall communicating between said gas supply receptacle and said gas supply port of said side wall manifold.

6. The plasma reactor of claim 1 wherein said conductive rings each comprise half-circular rings joined together end-to-end.

7. The plasma reactor of claim 6 further comprising screw fasteners at respective ends of said half circular rings.

8. The plasma reactor of claim 1 wherein said conductive rings comprise conductive films on the surface of said hollow tube.

9. The plasma reactor of claim 1 wherein said hollow tube and each of said rings have conformal cross-sectional shapes that are one of: (a) rectangular, (b) square, (c) circular.

\* \* \* \* \*